(12) United States Patent
Jefremow et al.

(10) Patent No.: US 12,206,344 B2
(45) Date of Patent: Jan. 21, 2025

(54) RESOLVER-TO-DIGITAL CONVERSION WITH ROTATION SPEED OFFSET

(71) Applicant: Infineon Technologies AG, Neubiberg (DE)

(72) Inventors: Mihail Jefremow, Augsburg (DE); Jürgen Schäfer, Oberhaching (DE); Michael Augustin, Villach (AT); Chandresh Patel, Langen (DE); Arndt Voigtländer, Antdorf (DE)

(73) Assignee: Infineon Technologies AG, Neubiberg (DE)

( * ) Notice: Subject to any disclaimer, the term of this patent is extended or adjusted under 35 U.S.C. 154(b) by 211 days.

(21) Appl. No.: 18/069,307

(22) Filed: Dec. 21, 2022

(65) Prior Publication Data

US 2024/0213898 A1    Jun. 27, 2024

(51) Int. Cl.
  H03M 1/48    (2006.01)
  H02P 21/09    (2016.01)
  H02P 21/10    (2016.01)

(52) U.S. Cl.
  CPC .............. H02P 21/10 (2013.01); H02P 21/09 (2016.02); H03M 1/485 (2013.01)

(58) Field of Classification Search
  CPC .. H03M 1/485; H03M 1/0617; H03M 1/0827; H03M 1/1245; H03M 1/164; H03M 1/185; H03M 1/645; B60L 1/003; B60L 15/00; B60L 2240/14; B60L 2240/421; B60L 2240/429; B60L 2240/642; B60L 2250/26; B60L 2260/46; B60L 3/0092; G05B 19/353; G05B 2219/37481; G05B 2219/41065; H02P 21/18; H02P 2207/05; H02P 23/14; H02P 23/20; H02P 6/16; H02P 6/182
  USPC ........................ 341/1–11, 35, 110–112, 117
  See application file for complete search history.

(56) References Cited

U.S. PATENT DOCUMENTS

| | | | |
|---|---|---|---|
| 7,352,305 B2 * | 4/2008 | Kiriyama | H03M 1/207 341/111 |
| 8,004,434 B2 * | 8/2011 | Nakazato | H03M 1/1038 341/115 |
| 8,487,563 B2 * | 7/2013 | Kawakami | H02P 6/16 318/757 |
| 8,716,964 B2 * | 5/2014 | Tanaka | H02P 23/0027 318/400.01 |
| 9,182,251 B2 * | 11/2015 | Shinohara | G01D 5/2073 |
| 10,530,383 B2 * | 1/2020 | Kurooka | H03M 1/645 |
| 10,884,037 B2 * | 1/2021 | Chellamuthu | G01D 3/08 |

(Continued)

*Primary Examiner* — Linh V Nguyen
(74) *Attorney, Agent, or Firm* — Banner & Witcoff Ltd.

(57) ABSTRACT

A resolver-to-digital converter, comprising: a feedback (FB) filter chain loop having a state observer configured to estimate a rotation speed and a rotation angle of an object, based on a pair of input sine and cosine signals that are amplitude-modulated (AM) to correspond with the rotation angle of the object; and a feedforward (FF) filter chain path configured to estimate the rotation speed of the object based on the pair of input sine and cosine signals, wherein the state observer of the FB filter chain loop is further configured to offset the estimated rotation speed of the FB filter chain loop with the estimated rotation speed of the FF filter chain path to decrease a settling time of the estimated rotation angle.

20 Claims, 8 Drawing Sheets

(56) References Cited

U.S. PATENT DOCUMENTS

| | | | |
|---|---|---|---|
| 2008/0265831 A1* | 10/2008 | Imai | H02P 6/183 |
| | | | 318/811 |
| 2009/0179634 A1* | 7/2009 | Nakazato | H03M 1/0624 |
| | | | 324/207.25 |
| 2011/0090104 A1* | 4/2011 | Sata | H03M 1/485 |
| | | | 341/116 |
| 2012/0197591 A1* | 8/2012 | Shinohara | G01D 5/2448 |
| | | | 324/207.25 |

* cited by examiner

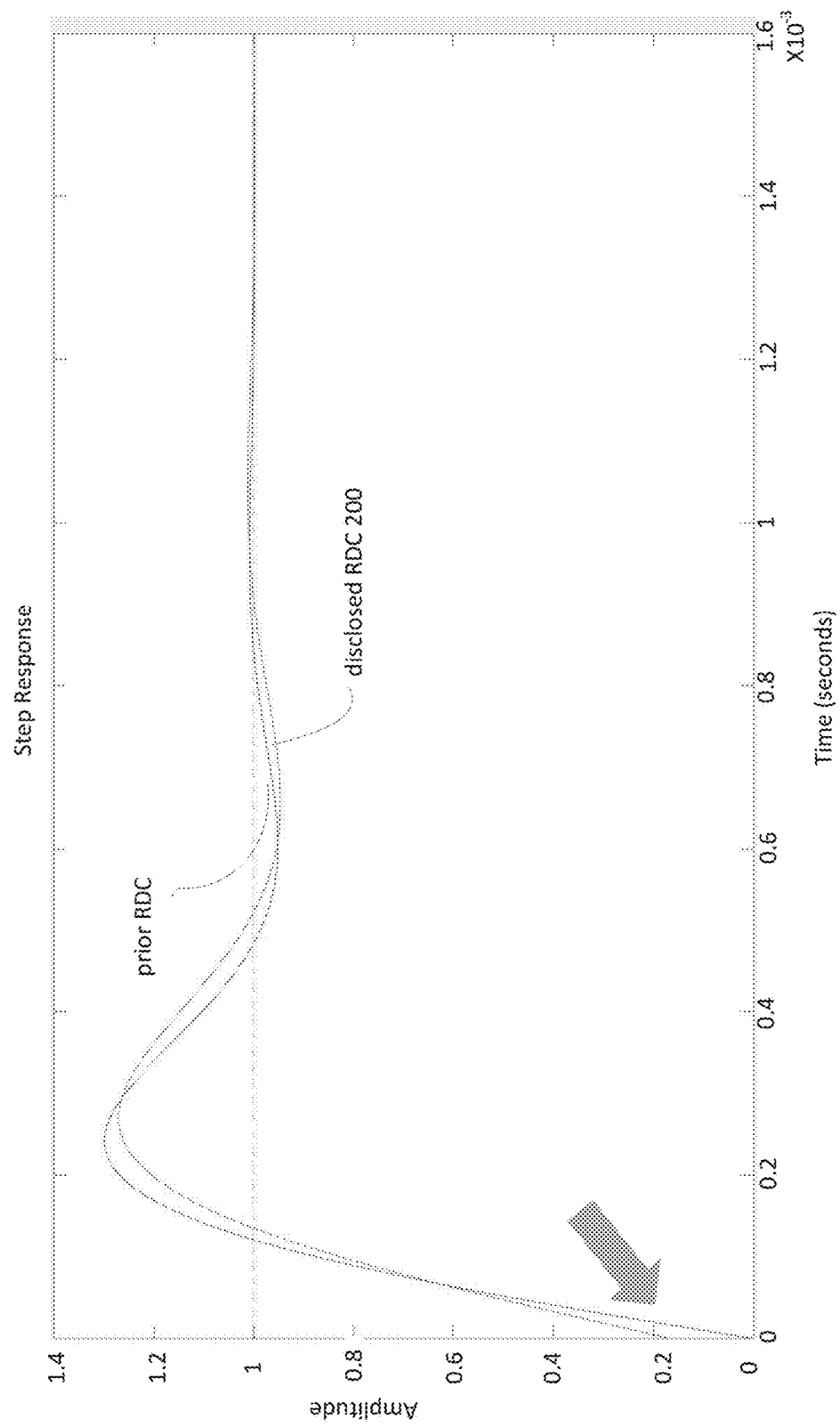

RESOLVER-TO-DIGITAL CONVERSION WITH ROTATION SPEED OFFSET

BACKGROUND

A resolver is a rotation angle sensor used in a traction inverter to drive a motor of an electric vehicle. The more quickly and accurately the resolver senses the motor's rotation angle and speed, the higher the motor efficiency and torque.

BRIEF DESCRIPTION OF THE DRAWINGS

FIG. 4B illustrates a step response in accordance with aspects of the disclosure.

DETAILED DESCRIPTION

This disclosure is directed to a resolver-to-digital converter configured to estimate a rotation angle of a motor accurately with a decreased settling time.

Figure 1:
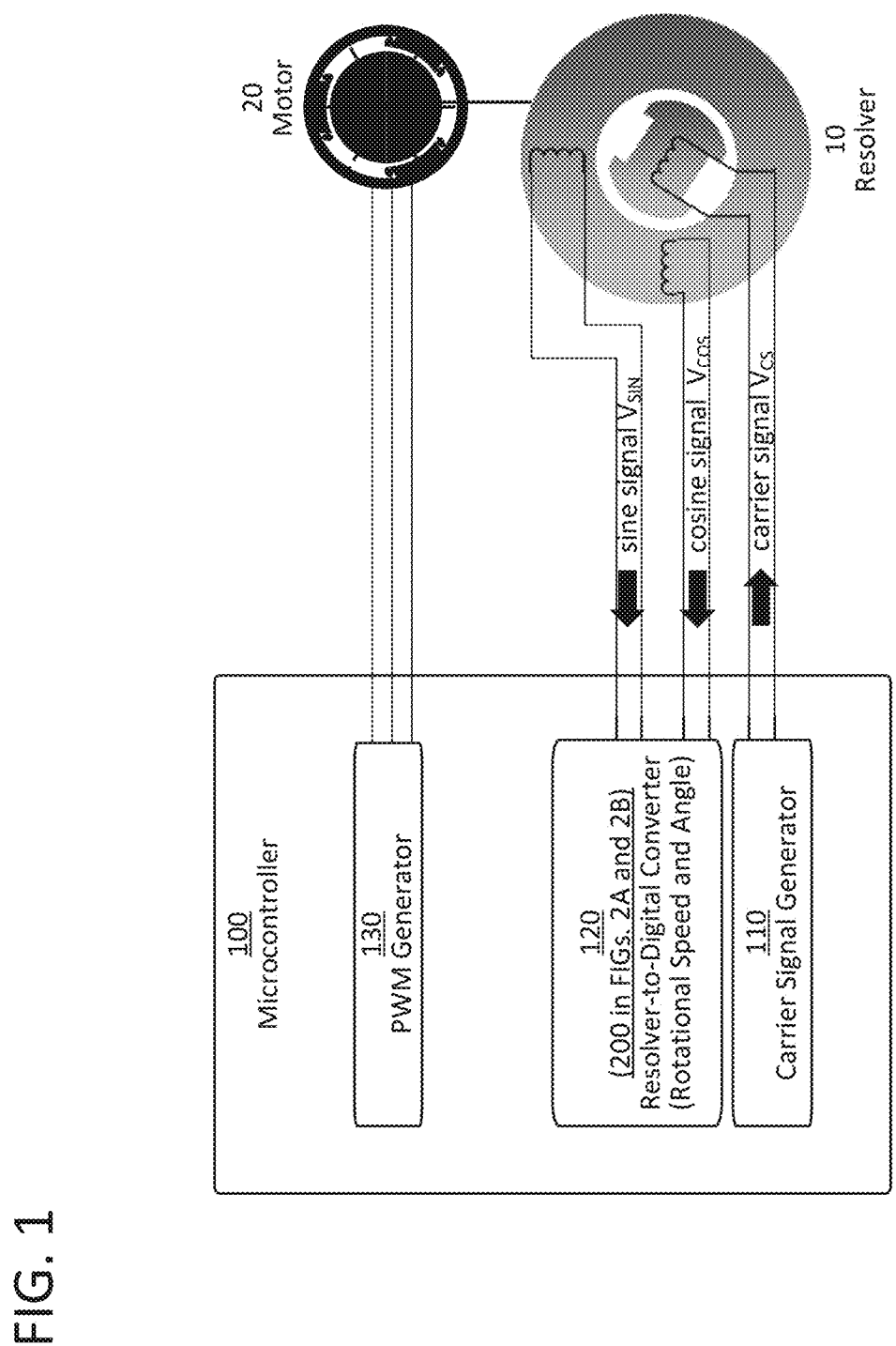
FIG. 1 illustrates a schematic diagram of a microcontroller having a resolver-to-digital converter in accordance with aspects of the disclosure.

FIG. 1 illustrates a schematic diagram of a microcontroller 100 comprising a resolver-to-digital converter 120 in accordance with aspects of the disclosure. The microcontroller 100 also has a carrier signal generator 110 and a PWM (pulse width modulation) generator 130. The microcontroller 100 is shown coupled to a resolver 10 and to a permanent magnet synchronous motor (PMSM) 20.

During operation, the carrier signal generator 110 generates a carrier signal $V_{CS}$ for output to the resolver 10. The resolver 10 is an electrical transformer that measures a rotational angle of a rotatable shaft of the motor 20. The resolver 10 has three distinct coil windings—a primary winding for carrier signal CS, and two secondary windings for respective sine and cosine signals. The secondary windings are mounted 90° apart from each other in relation to the motor shaft. The primary winding is mounted on the motor shaft and in operation is excited by the carrier signal $V_{CS}$ which is applied thereto. As the motor shaft rotates, the excited primary winding induces voltages in the secondary windings varying sinusoidally, thereby generating sine and cosine signals, which are amplitude modulated (AM) and output as a resolver signal. The resolver-to-digital converter 120 uses the AM sine and cosine signals to determine a rotational angle θ of the motor shaft (i.e., sine θ/cosine θ=tangent θ).

Figure 2A:
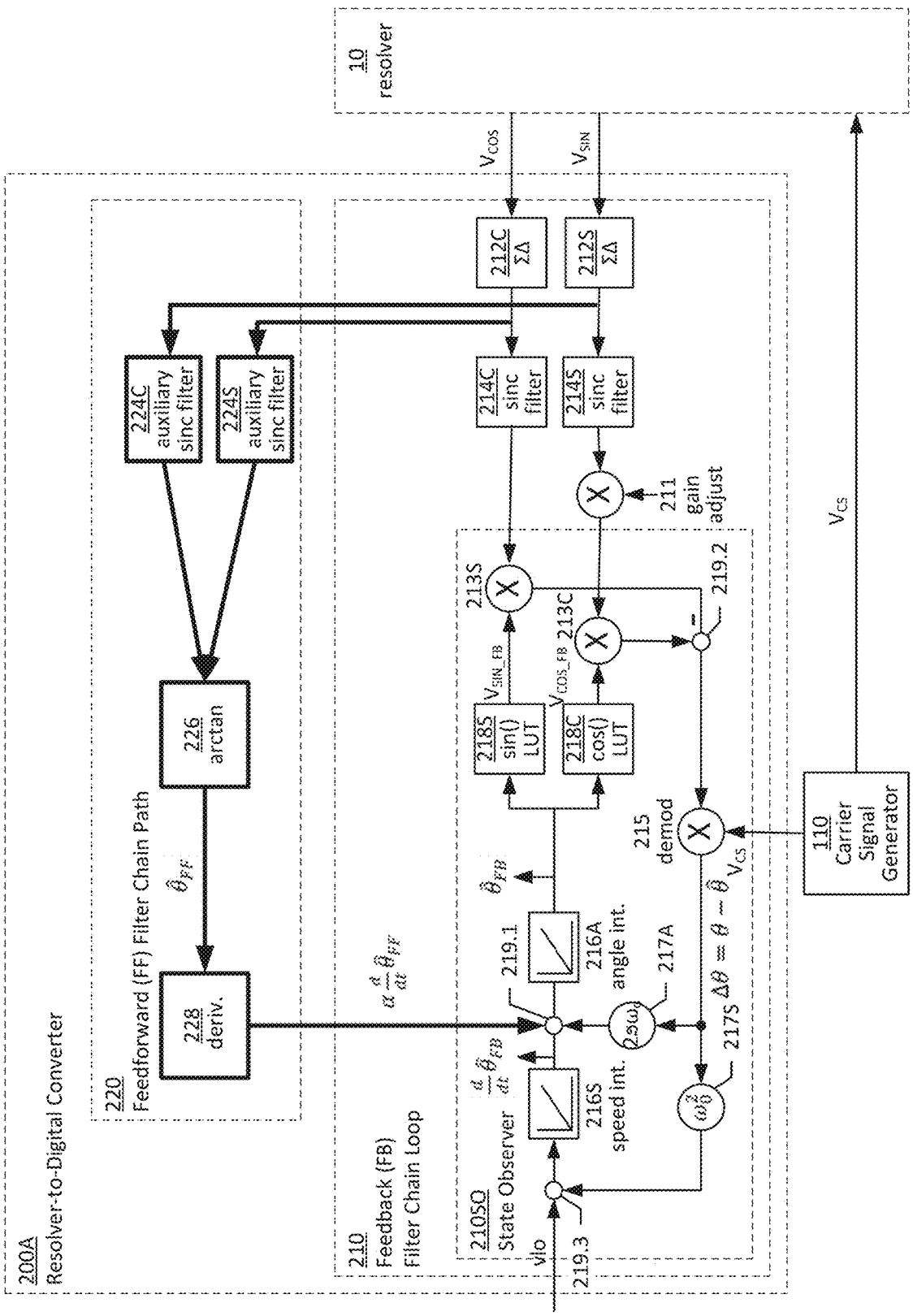
FIG. 2A illustrates a circuit diagram of a resolver-to-digital converter in accordance with aspects of the disclosure.

FIG. 2A illustrates a circuit diagram of a resolver-to-digital converter 200A in accordance with aspects of the disclosure.

By way of overview, the resolver-to-digital converter 200A comprises a feedback (FB) filter chain loop 210 and a feedforward (FF) filter chain path 220, each of which estimates a rotation speed of the motor 20. The FB filter chain loop 210 is a loop with integrators, and thus takes longer that the FF filter chain path 220 to settle to its respective estimated rotation speed. The FF filter chain path 220 adds its estimated rotation speed to that of the FB filter chain loop 210 as an offset, thereby causing the FB filter chain loop 210 to settle to an estimated rotational angle of the motor 20 more quickly.

The FB filter chain loop 210 comprises a pair of delta-sigma analog-to-digital converters (DS-ADCs) 212 (212C, 212S), a pair of sinc filters 214 (214C, 214S), a state observer 210SO, and other miscellaneous elements.

The pair of DS-ADCs 212 is coupled between the resolver 10 and to inputs of both the FB filter chain loop 210 and the FF filter chain path 220. The pair of DS-ADCs 212 is configured to convert a pair of input sine and cosine signals $V_{SIN}$, $V_{COS}$ received from the resolver 10 from analog to digital. The pair of input sine and cosine signals $V_{SIN}$, $V_{COS}$ are amplitude-modulated (AM) to correspond with the rotation angle θ of the object, in this case, the motor shaft. These input signals may be noisy; they are supposed to be 90 degrees apart, but due to the noise, they may not be.

The pair of sinc filters 214 is configured to filter the pair of digital input sine and cosine signals $V_{SIN}$, $V_{COS}$. As is known, a sinc filter is a type of low pass filter that removes frequency components above a given cutoff frequency. The sinc-filtered sine signal may be gain adjusted by multiplier 211, the gain value of which is based on system design.

The state observer 210SO is configured to estimate a rotation speed $$\frac{d}{dt}\hat{\theta}_{FB}$$

and a rotation angle $\hat{\theta}_{FB}$ of an object (i.e., the motor shaft) based on the pair of input sine and cosine signals $V_{SIN}$, $V_{COS}$. The state observer 210SO is further configured to receive the estimated rotation speed $$\alpha\frac{d}{dt}\hat{\theta}_{FF}$$

of the FF filter chain path 220 in order to offset the estimated rotation speed $$\frac{d}{dt}\hat{\theta}_{FB}$$

of the FB filter chain loop 210. As mentioned above, this is done to decrease the settling time of the estimated rotation angle $\hat{\theta}_{FB}$ of the feedback filter chain loop 210.

The state observer 210SO comprises a rotation speed integrator 216S, an adder 219.1, a rotation angle integrator 216A, a sine look-up-table (LUT) 218S, a cosine LUT 218C, along with other elements. Some of the elements are not shown so as to not obscure more important aspects of the disclosure.

The rotation speed integrator 216S is configured to integrate an estimated rotation angle error signal Δθ of the motor shaft, and to output the rotation speed estimate $$\frac{d}{dt}\hat{\theta}_{FB}$$

of the FB filter chain loop 210. As is known, an integrator integrates a signal over a carrier period to generate an envelope signal used for subsequent processing.

The adder 219.1 is coupled between the rotation angle integrator 216A and the rotation speed integrator 216S, and also coupled to an output of the FF filter chain path 220. The adder 219.1 is configured to add the estimated rotation speed $$\frac{d}{dt}\hat{\theta}_{FB}$$

of the FB filter chain loop 210, the estimated rotation speed $$\alpha\frac{d}{dt}\hat{\theta}_{FF}$$

of the FF filter chain path 220, and a dampened version of the estimated rotation angle error signal Δθ. The output of the adder 219.1 is an offset version of the estimated rotation speed $$\frac{d}{dt}\hat{\theta}_{FB}.$$

The rotation angle integrator 216A is configured to integrate the offset version of the estimated rotation speed $$\frac{d}{dt}\hat{\theta}_{FB}$$

and output the estimated rotation angle $\hat{\theta}_{FB}$ of the motor shaft.

The sine LUT 218S is configured to determine a feedback sine signal $V_{SIN\_FB}$ based on the estimated rotation angle $\hat{\theta}_{FB}$ of the object. And the cosine LUT 218C is configured to determine a feedback cosine signal $V_{COS\_FB}$ based on the estimated rotation angle $\hat{\theta}_{FB}$ of the object. The FB sine and cosine signals $V_{SIN\_FB}$, $V_{COS\_FB}$ are then combined with the respective input cosine and sine signals $V_{COS}$, $V_{SIN}$ to output an estimated rotation angle error signal Δθ, which is a difference between state observer 210SO and the actual motor shaft. More specifically, the multiplier 213S is configured to multiply the FB sine signal $V_{SIN\_FB}$ by the sinc-filtered input cosine signal $V_{COS}$. Similarly, the multiplier 213C is configured to multiply the FB cosine signal $V_{COS\_FB}$ by the gain-adjusted sinc-filtered input sine signal $V_{SIN}$. A subtractor 219.2 subtracts the output of multiplier 213S from the output of multiplier 213C to output a difference signal representing the estimated rotation angle error. The demodulator 215 then demodulates the difference signal by multiplying it with the carrier signal $V_{CS}$ to output a demodulated version of the signal, that is, the estimated rotational angle error signal Δθ.

The estimated rotational angle error signal Δθ is then gain-adjusted by two constants provided by the system. More specifically, the multiplier 217S multiplies the estimated rotational angle error signal Δθ by $\omega_o^2$ to output a gain-adjusted version of the rotational speed error signal, which the adder 219.3 combines with a measured acceleration signal vlo to output the input to the rotational speed integrator 216S, thereby closing the loop. And the multiplier 217A multiplies the estimated rotational angle error signal Δθ by a damping constant 29w, to output another gain-adjusted version of the rotational angle error signal Δθ, which is one of the inputs to adder 219.1. As discussed above, the output of the adder 219.1 is input to the rotational angle integrator 216A, the output of which is the estimated rotational angle $\hat{\theta}_{FB}$, which is for motor control.

The FF filter chain path 220 is configured to estimate the rotation speed $$\alpha\frac{d}{dt}\hat{\theta}_{FF}$$

of the motor shaft based on the pair of input sine and cosine signals $V_{SIN}$, $V_{COS}$, and feed this estimate into the FB filter chain loop 210 between the rotation speed integrator 216S and the rotation angle integrator 216A. As mentioned above, the FB filter chain loop 210 is relatively slow due to the integrators 216. The FF filter chain path 220 effectively injects an offset into the FB filter chain loop 210 in order to speed up the loop 210. Because the FF filter chain path 220 does not require a settling time, the FF filter chain path 220 arrives at the estimated rotational angle much faster than the FB filter chain loop 210.

The FF filter chain path 220 is coupled between outputs of the pair of DS-ADCs 212 and the adder 219.1 of the FB filter chain loop 210. The FF filter chain path 220 comprises a pair of auxiliary sinc filters 224 (224S, 224C), an inverse tangent element 226, and a derivative element 228. The pair of auxiliary sinc filters 224 is configured to filter the pair of input sine and cosine signals $V_{SIN}$, $V_{COS}$. The inverse tangent element 226 is configured to determine an inverse tangent signal of the sinc-filtered versions of the pair of sine and cosine signals $V_{SIN}$, $V_{COS}$ and output an estimated rotation angle $\hat{\theta}_{FF}$. The derivative element 228 is configured to take a derivative of the estimated rotation angle $\hat{\theta}_{FF}$ and output the estimated rotation speed $$\alpha\frac{d}{dt}\hat{\theta}_{FF}$$

of the FF filter path 220, wherein a is a constant rotation speed.

The resolver-to-digital converter 200A elements to the left of the sinc filters 214, 224 are generally implemented in software, with the sinc filters 224 and DS-ADCs generally implemented in hardware. However, the disclosure is not necessarily limited in this respect.

Figure 2B:
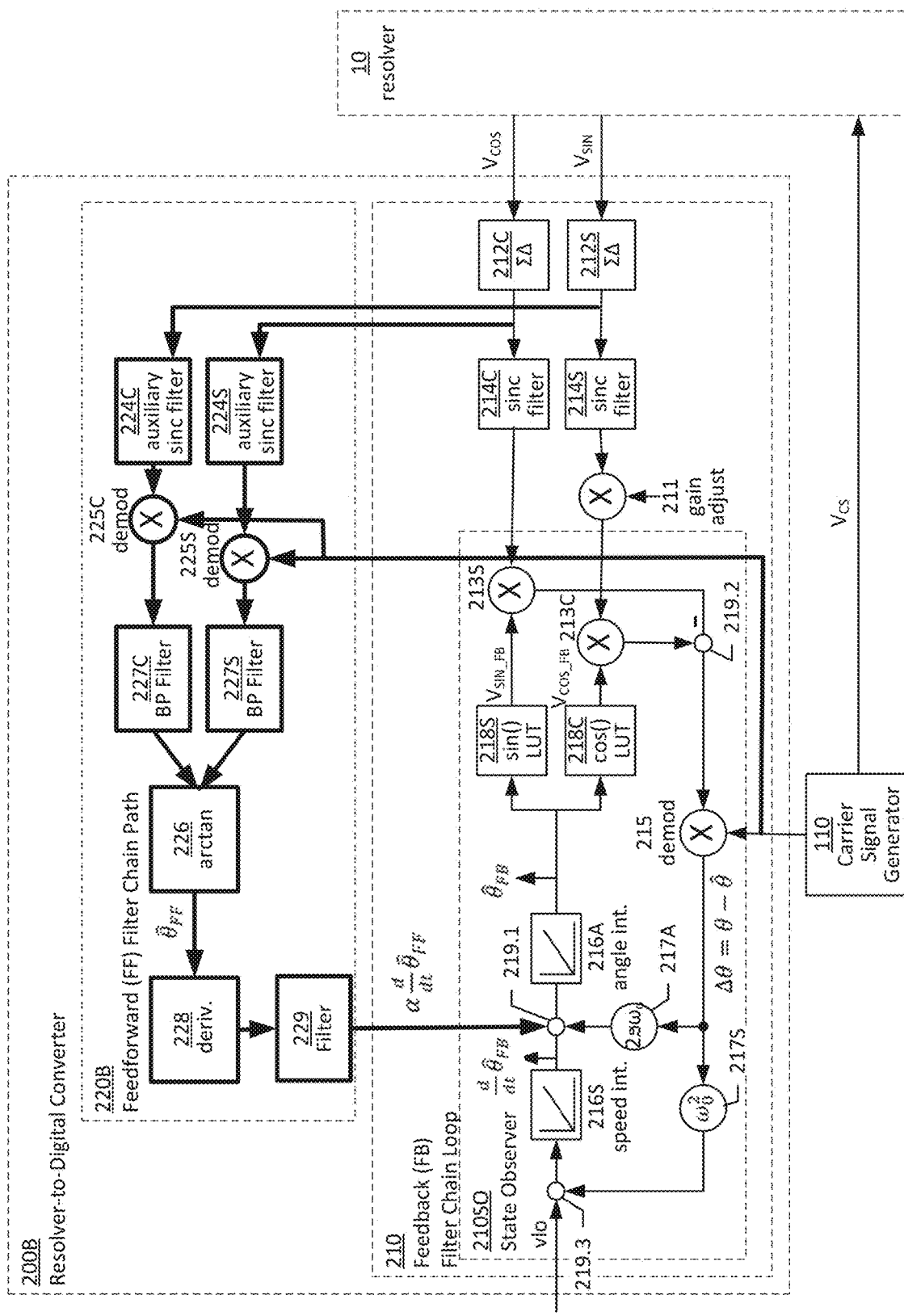
FIG. 2B illustrates a circuit diagram of a resolver-to-digital converter in accordance with aspects of the disclosure.

FIG. 2B illustrates a circuit diagram of a resolver-to-digital converter 200B in accordance with aspects of the disclosure.

The resolver-to-digital converter 200B is similar to the resolver-to-digital converter 200A of FIG. 2A, except that the FF filter chain path 220B additionally comprises a pair of demodulators 225 (225S, 225C), a pair of bandpass filters 227 (227S, 227C), and a filter 229.

The input sine and cosine signals $V_{SIN}$, $V_{COS}$ in reality are distorted. Therefore, between the inverse tangent element 226 and the pair of auxiliary sinc filters 224, there is a pair of demodulators 225 (225S, 225C). The demodulators 225 are configured to perform a demodulation function by multiplying the pair of sinc-filtered input sine and cosine signals $V_{SIN}$, $V_{COS}$ with the carrier signal $V_{CS}$ from the carrier signal generator 110. The pair of bandpass filters 227 then bandpass filter the pair of demodulated sine and cosine signals $V_{SIN}$, $V_{COS}$. As in the FF filter chain path 220A of FIG. 2B, the inverse tangent element 226 performs an arctan operation to output an estimated rotational angle $\hat{\theta}_{FF}$, and the derivative element 228 performs a derivative on the estimated rotation angle $\hat{\theta}_{FF}$ to output the estimated rotation speed $$\alpha \frac{d}{dt}\hat{\theta}_{FF}.$$

Finally, the filter 229 filters the estimated rotation speed $$\alpha \frac{d}{dt}\hat{\theta}_{FF}$$

to be input to adder 219.1.

Figure 2C:
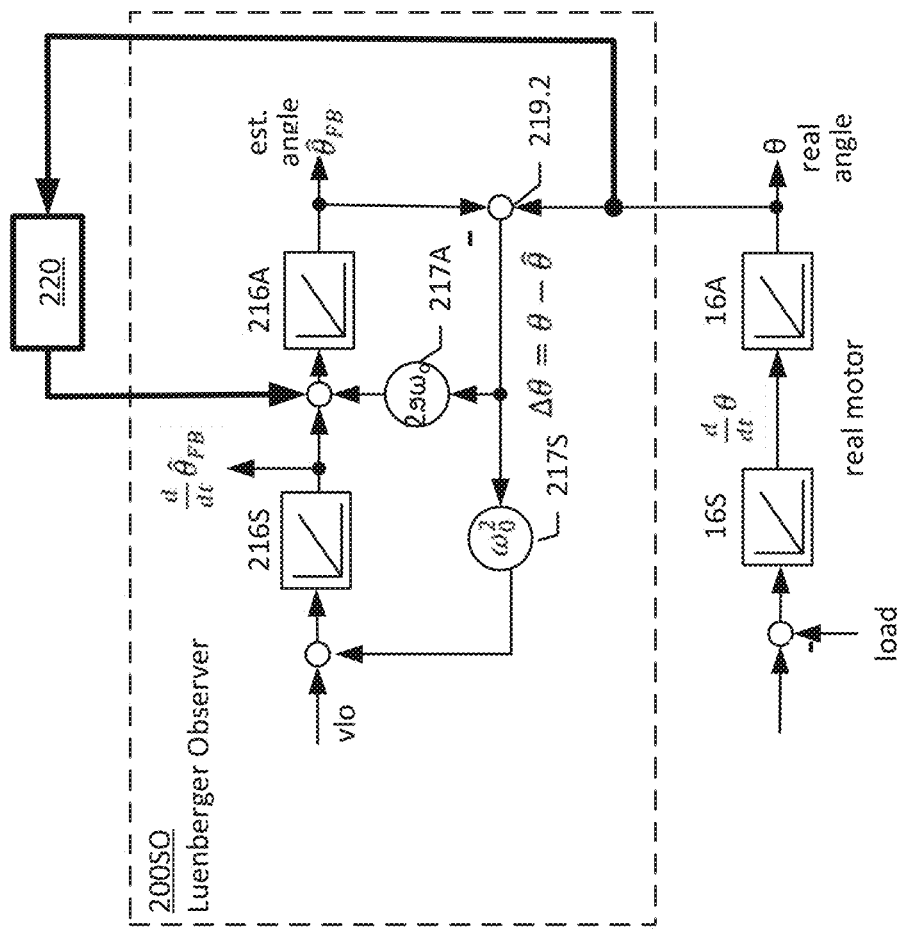
FIG. 2C illustrates a circuit diagram of a simplified version of the state observer of the resolver-to-digital converters of FIGS. 2A and 2B in accordance with aspects of the disclosure.

FIG. 2C illustrates a circuit diagram of a simplified version of the state observer 200SO of the resolver-to-digital converters 200 of FIGS. 2A and 2B in accordance with aspects of the disclosure.

The state observer 200SO of FIGS. 2A and 2B is a Luenberger observer, though the disclosure is not necessarily limited in this respect.

The Luenberger observer is shown coupled to a real motor. The Luenberger observer estimates the real angle θ of the motor shaft with an estimated rotation angle $\hat{\theta}_{FB}$, and then updates the estimated rotation angle $\hat{\theta}_{FB}$ by the angle error signal Δθ. The upper portion of the circuit diagram represents the FF filter path 220. The lower portion of the figure represents the real motor with its rotation speed integrator 16S and rotation angle integrator 16A to output the real rotation speed $$\frac{d}{dt}\theta$$

and real rotation angle θ, respectively.

The transfer function of the state observer 200SO (Luenberger observer) plus FF filter chain path 220 is represented as:

$$\text{Transfer Function} = F \times \frac{\alpha s^2 + 2s\vartheta\omega_o + \omega_o^2}{s^2(1+\alpha) + 2s\vartheta\omega_o + \omega_o^2} \quad \text{(Equation 1)}$$

The transfer function has two zeros and two poles. Mathematically, the FF filter chain path 220 is a second zero in the transfer function represented by $\alpha s^2$ in the numerator. The F represents a constant, the value of which is outside the scope of this disclosure.

Figure 3:
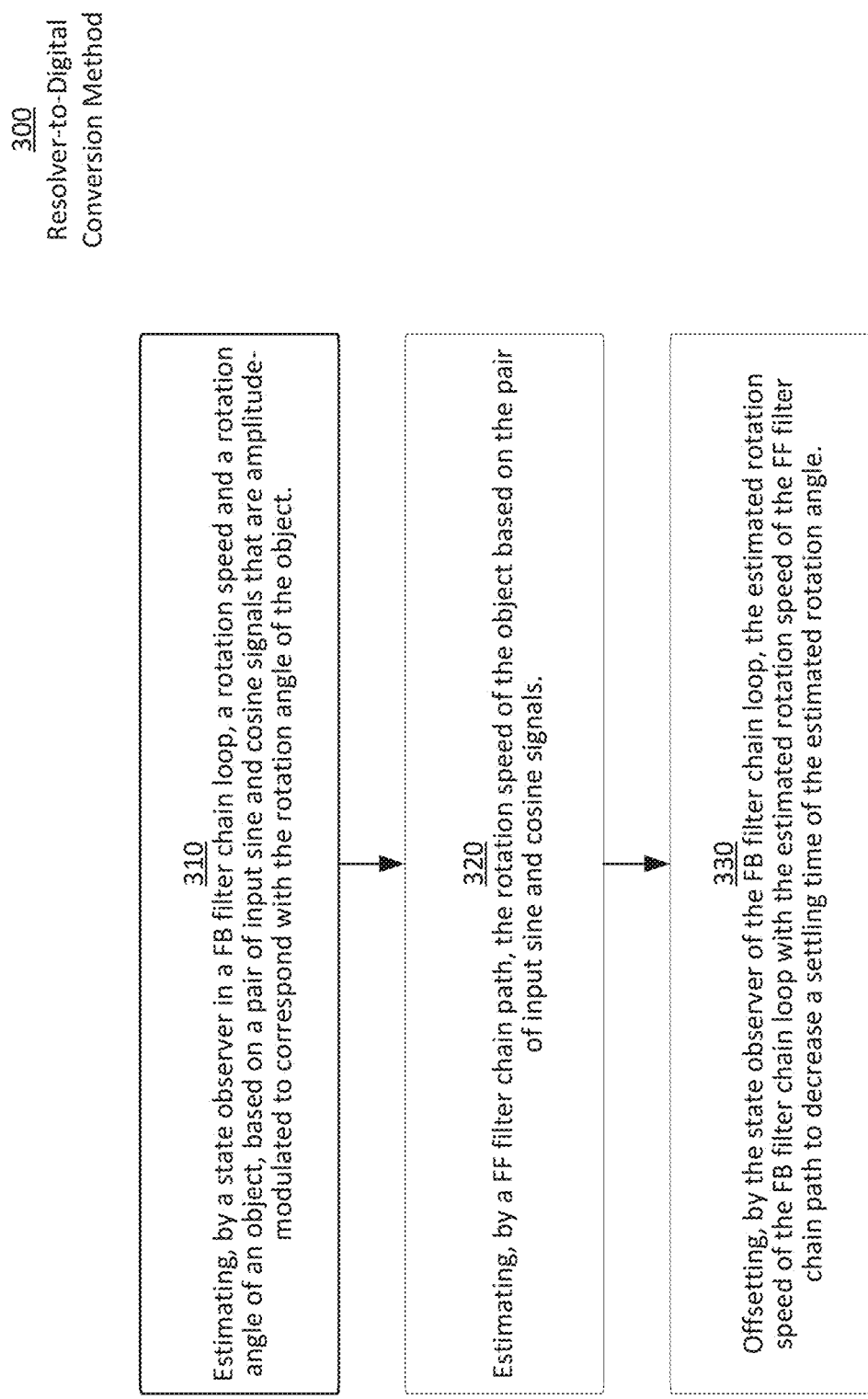
FIG. 3 illustrates a flowchart of a resolver-to-digital conversion method in accordance with aspects of the disclosure.

FIG. 3 illustrates a flowchart of a resolver-to-digital conversion method 300 in accordance with aspects of the disclosure.

In step 310, a state observer 210SO in a feedback (FB) filter chain loop 210 estimates a rotation speed $$\frac{d}{dt}\hat{\theta}_{FB}$$

and a rotation angle $\hat{\theta}_{FB}$ of an object, based on a pair of input sine and cosine signals $V_{SIN}$, $V_{COS}$ that are amplitude-modulated (AM) to correspond with the rotation angle θ of the object.

At step 320, a feedforward (FF) filter chain path 220 estimates the rotation speed $$\frac{d}{dt}\hat{\theta}_{FF}$$

of the object based on the pair of input sine and cosine signals $V_{SIN}$, $V_{COS}$.

At step 330, the state observer 210SO of the FB filter chain loop 210 offsets the estimated rotation speed $$\frac{d}{dt}\hat{\theta}_{FB}$$

of the FB filter chain loop 210 with the estimated rotation speed $$\frac{d}{dt}\hat{\theta}_{FF}$$

of the FF filter chain path 220 to decrease a settling time of the estimated rotation angle $\hat{\theta}_{FB}$.

Figure 4A:
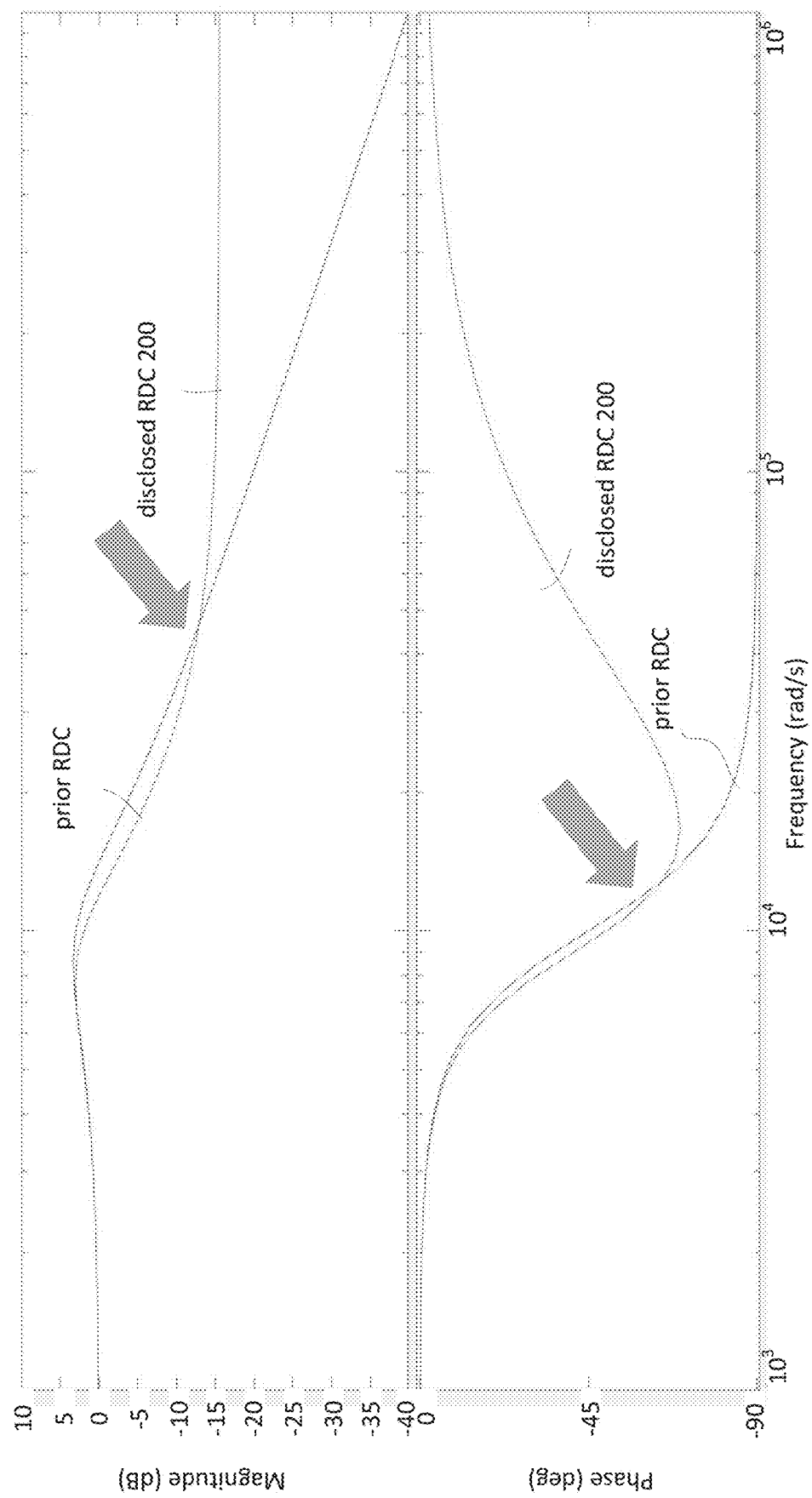
FIG. 4A illustrates a Bode diagram in accordance with aspects of the disclosure.

FIG. 4A illustrates a Bode diagram 400A in accordance with aspects of the disclosure. A Bode diagram has two parts—magnitude over frequency, and phase angle over frequency. Bode diagram 400A compares a transfer function of the disclosed resolver-to-digital converter 200 with that of a prior converter. As can be seen, the angle transfer function of the disclosed converter 200 results in a phase shift of +90 degrees.

FIG. 4B illustrates a step response 400B in accordance with aspects of the disclosure. As can be seen, a transient response of the disclosed converter 200 has a offset in the beginning, which reduces the startup time.

Figure 4C:
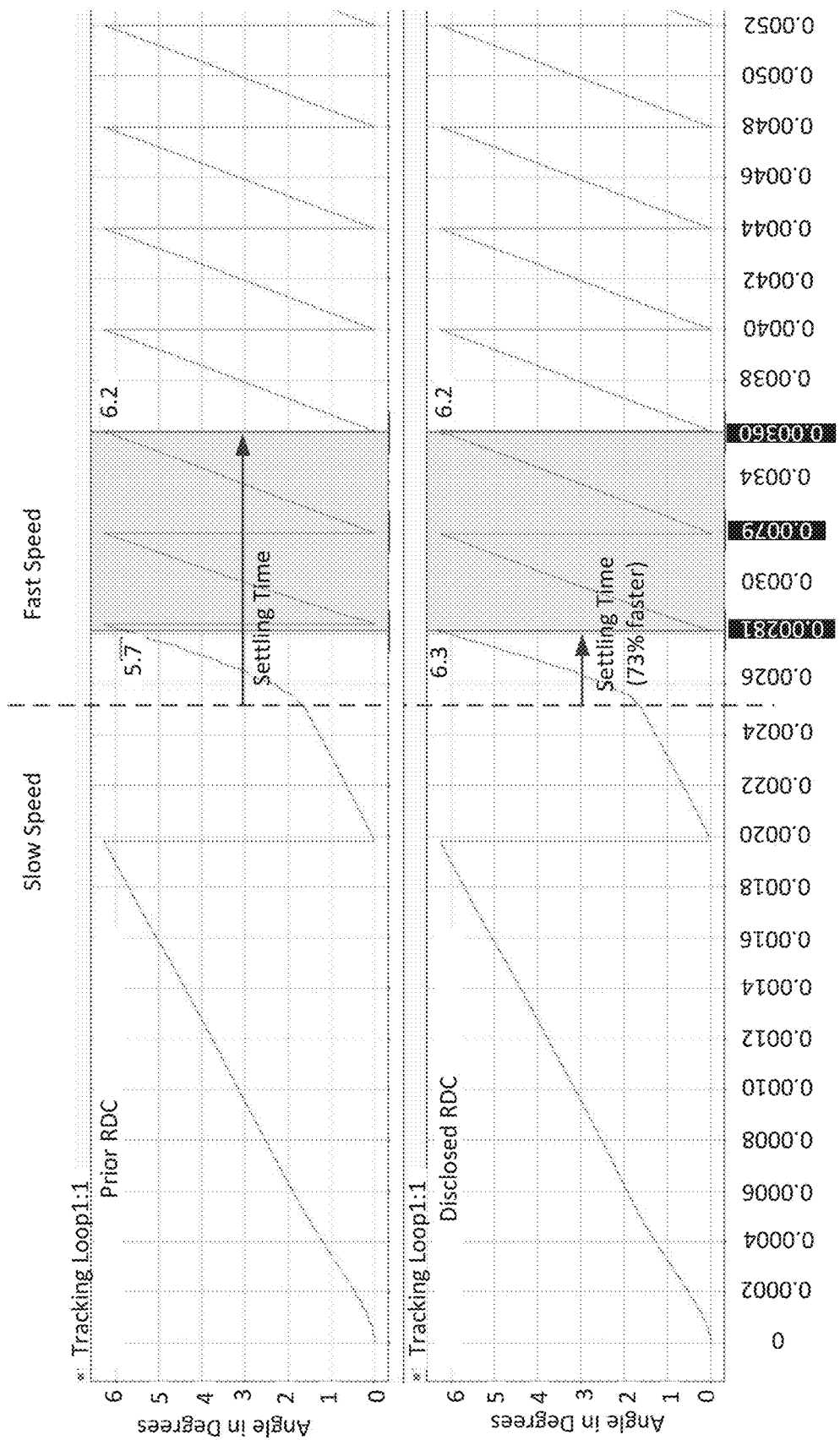
FIG. 4C illustrates signal diagrams of angle versus speed in accordance with aspects of the disclosure.

FIG. 4C illustrates signal diagrams 400C of angle versus speed in accordance with aspects of the disclosure. The upper diagram shows the angle versus speed of a prior resolver-to-digital converter. The lower diagram shows the angle versus speed of the disclosed resolver-to-digital converter 200. As can be seen, the disclosed resolver-to-digital converter 200 has a settling time that is 73% faster than that of the prior resolver-to-digital converter.

It is appreciated that throughout the disclosure some aspects of the resolver-to-digital converter 20 are not shown or described so as to not obscure more important aspects of the disclosure.

The techniques of this disclosure may also be described in the following examples.

Example 1. A resolver-to-digital converter, comprising: a feedback (FB) filter chain loop having a state observer configured to estimate a rotation speed and a rotation angle of an object, based on a pair of input sine and cosine signals that are amplitude-modulated (AM) to correspond with the rotation angle of the object; and a feedforward (FF) filter chain path configured to estimate the rotation speed of the object based on the pair of input sine and cosine signals, wherein the state observer of the FB filter chain loop is further configured to offset the estimated rotation speed of the FB filter chain loop with the estimated rotation speed of the FF filter chain path to decrease a settling time of the estimated rotation angle.

Example 2. The resolver-to-digital converter of example 1, wherein the state observer comprises a rotation angle integrator configured to integrate the offset estimated rotation speed and output the estimated rotation angle, and an output of the FF filter chain path is coupled upstream the rotation angle integrator.

Example 3. The resolver-to-digital converter of example 2, wherein the state observer comprises a rotation speed integrator configured to integrate an estimated rotation angle error of the object, and to output the rotation speed estimate of the FB filter chain loop.

Example 4. The resolver-to-digital converter of example 3, wherein the state observer comprises an adder coupled between the rotation angle integrator and the rotation speed integrator and to an output of the FF filter chain path, and the adder is configured to add the estimated rotation speed of the FB filter chain loop with the estimated rotation speed of the FF filter chain path.

Example 5. The resolver-to-digital converter of any one or more of examples 1-4, further comprising: a pair of delta-sigma analog-to-digital converters (DS-ADCs) coupled to inputs of the FB filter chain loop and the FF filter chain path, and configured to convert the pair of input sine and cosine signals from analog to digital.

Example 6. The resolver-to-digital converter of any one or more of examples 1-5, wherein: a first pair of sinc filters in the FB filter chain loop, and configured to filter the pair of input sine and cosine signals, and a second pair of sinc filters in the FF filter chain path, and configured to filter the pair of input sine and cosine signals.

Example 7. The resolver-to-digital converter of example 6, wherein the FF filter chain path comprises: a pair of bandpass filters coupled between the second pair of sinc filters and an output of the FF filter chain path, and configured to bandpass filter the pair of sinc-filtered input sine and cosine signals.

Example 8. The resolver-to-digital converter of any one or more of examples 1-7, wherein the state observer is a Luenberger observer.

Example 9. The resolver-to-digital converter of any one or more of examples 1-8, wherein the FF filter chain path is configured to determine an inverse tangent signal of the pair of sine and cosine signals and output an estimated rotation angle on which the estimated rotation speed of the FF filter path is based.

Example 10. The resolver-to-digital converter of any one or more of examples 1-9, wherein the state observer of the FB filter chain loop comprises: a sine look-up-table (LUT) configured to determine a feedback sine signal based on the estimated rotation angle of the object; and a cosine LUT configured to determine a feedback cosine signal based on the estimated rotation angle of the object, wherein the FB sine and cosine signals are combined with the respective input cosine and sine signals to output an estimated rotation angle error signal.

Example 11. A microcontroller comprising the resolver-to-digital converter of any one or more of examples 1-10.

Example 12. A resolver-to-digital conversion method, comprising: estimating, by a state observer in a feedback (FB) filter chain loop, a rotation speed and a rotation angle of an object, based on a pair of input sine and cosine signals that are amplitude-modulated (AM) to correspond with the rotation angle of the object; estimating, by a feedforward (FF) filter chain path, the rotation speed of the object based on the pair of input sine and cosine signals; and offsetting, by the state observer of the FB filter chain loop, the estimated rotation speed of the FB filter chain loop with the estimated rotation speed of the FF filter chain path to decrease a settling time of the estimated rotation angle.

Example 13. The resolver-to-digital conversion method of example 12, further comprising: integrating, by a rotation angle integrator of the state observer, the offset estimated rotation speed; and outputting the estimated rotation angle, wherein an output of the FF filter chain path is coupled upstream the rotation angle integrator.

Example 14. The resolver-to-digital conversion method of example 13, further comprising: integrating, by a rotation speed integrator of the state observer, an estimated rotation angle error signal of the object; and outputting the rotation speed estimate of the FB filter chain loop.

Example 15. The resolver-to-digital conversion method of example 14, further comprising: adding, by an adder coupled between the rotation angle integrator and the rotation speed integrator in the state observer and to an output of the FF filter chain path, the estimated rotation speed of the FB filter chain loop with the estimated rotation speed of the FF filter chain path.

Example 16. The resolver-to-digital conversion method of any one or more of examples 12-15, further comprising: converting, by a pair of delta-sigma analog-to-digital converters (DS-ADCs) coupled to inputs of the FB filter chain loop and the FF filter chain path, the pair of input sine and cosine signals from analog to digital.

Example 17. The resolver-to-digital conversion method of any one or more of examples 12-16, further comprising: filtering, by a first pair of sinc filters in the FB filter chain loop, the pair of input sine and cosine signals; and filtering, by a second pair of sinc filters in the FF filter chain path, the pair of input sine and cosine signals.

Example 18. The resolver-to-digital conversion method of example 17, further comprising: bandpass filtering, by a pair of bandpass filters coupled between the second pair of sinc filters and an output of the FF filter chain path, the pair of sinc-filtered input sine and cosine signals.

Example 19. The resolver-to-digital conversion method of any one or more of examples 12-18, further comprising: determining, by the FF filter chain path, an inverse tangent signal of the pair of sine and cosine signals; and outputting an estimated rotation angle on which the estimated rotation speed of the FF filter path is based.

Example 20. The resolver-to-digital conversion method of any one or more of examples 12-19, further comprising: determining, by a sine look-up-table (LUT) of the state observer of the FB filter chain loop, a feedback sine signal based on the estimated rotation angle of the object; determining, by a cosine LUT of the state observer of the FB filter chain loop, a feedback cosine signal based on the estimated rotation angle of the object; and combining the FB sine and cosine signals with the respective input cosine and sine signals to output an estimated rotation angle error signal.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A resolver-to-digital converter, comprising:
   a feedback (FB) filter chain loop having a state observer configured to estimate a rotation speed and a rotation angle of an object, based on a pair of input sine and cosine signals that are amplitude-modulated (AM) to correspond with the rotation angle of the object; and
   a feedforward (FF) filter chain path configured to estimate the rotation speed of the object based on the pair of input sine and cosine signals,
   wherein the state observer of the FB filter chain loop is further configured to offset the estimated rotation speed of the FB filter chain loop with the estimated rotation speed of the FF filter chain path to decrease a settling time of the estimated rotation angle.

2. The resolver-to-digital converter of claim 1, wherein the state observer comprises a rotation angle integrator configured to integrate the offset estimated rotation speed and output the estimated rotation angle, and an output of the FF filter chain path is coupled upstream the rotation angle integrator.

3. The resolver-to-digital converter of claim 2, wherein the state observer comprises a rotation speed integrator configured to integrate an estimated rotation angle error signal of the object, and to output the rotation speed estimate of the FB filter chain loop.

4. The resolver-to-digital converter of claim 3, wherein the state observer comprises an adder coupled between the rotation angle integrator and the rotation speed integrator and to an output of the FF filter chain path, and the adder is configured to add the estimated rotation speed of the FB filter chain loop with the estimated rotation speed of the FF filter chain path.

5. The resolver-to-digital converter of claim 1, further comprising:
   a pair of delta-sigma analog-to-digital converters (DS-ADCs) coupled to inputs of the FB filter chain loop and the FF filter chain path, and configured to convert the pair of input sine and cosine signals from analog to digital.

6. The resolver-to-digital converter of claim 1, wherein:
   a first pair of sinc filters in the FB filter chain loop, and configured to filter the pair of input sine and cosine signals, and
   a second pair of sinc filters in the FF filter chain path, and configured to filter the pair of input sine and cosine signals.

7. The resolver-to-digital converter of claim 6, wherein the FF filter chain path comprises:
   a pair of bandpass filters coupled between the second pair of sinc filters and an output of the FF filter chain path, and configured to bandpass filter the pair of sinc-filtered input sine and cosine signals.

8. The resolver-to-digital converter of claim 1, wherein the state observer is a Luenberger observer.

9. The resolver-to-digital converter of claim 1, wherein the FF filter chain path is configured to determine an inverse tangent signal of the pair of sine and cosine signals and output an estimated rotation angle on which the estimated rotation speed of the FF filter path is based.

10. The resolver-to-digital converter of claim 1, wherein the state observer of the FB filter chain loop comprises:
    a sine look-up-table (LUT) configured to determine a feedback sine signal based on the estimated rotation angle of the object; and
    a cosine LUT configured to determine a feedback cosine signal based on the estimated rotation angle of the object,
    wherein the FB sine and cosine signals are combined with the respective input cosine and sine signals to output an estimated rotation angle error signal.

11. A microcontroller comprising the resolver-to-digital converter of claim 1.

12. A resolver-to-digital conversion method, comprising:
    estimating, by a state observer in a feedback (FB) filter chain loop, a rotation speed and a rotation angle of an object, based on a pair of input sine and cosine signals that are amplitude-modulated (AM) to correspond with the rotation angle of the object;
    estimating, by a feedforward (FF) filter chain path, the rotation speed of the object based on the pair of input sine and cosine signals; and
    offsetting, by the state observer of the FB filter chain loop, the estimated rotation speed of the FB filter chain loop with the estimated rotation speed of the FF filter chain path to decrease a settling time of the estimated rotation angle.

13. The resolver-to-digital conversion method of claim 12, further comprising:
    integrating, by a rotation angle integrator of the state observer, the offset estimated rotation speed; and
    outputting the estimated rotation angle,
    wherein an output of the FF filter chain path is coupled upstream the rotation angle integrator.

14. The resolver-to-digital conversion method of claim 13, further comprising:
    integrating, by a rotation speed integrator of the state observer, an estimated rotation angle error signal of the object; and
    outputting the rotation speed estimate of the FB filter chain loop.

15. The resolver-to-digital conversion method of claim 14, further comprising:
    adding, by an adder coupled between the rotation angle integrator and the rotation speed integrator in the state observer and to an output of the FF filter chain path, the estimated rotation speed of the FB filter chain loop with the estimated rotation speed of the FF filter chain path.

16. The resolver-to-digital conversion method of claim 12, further comprising:
    converting, by a pair of delta-sigma analog-to-digital converters (DS-ADCs) coupled to inputs of the FB filter chain loop and the FF filter chain path, the pair of input sine and cosine signals from analog to digital.

17. The resolver-to-digital conversion method of claim 12, further comprising:
    filtering, by a first pair of sinc filters in the FB filter chain loop, the pair of input sine and cosine signals; and
    filtering, by a second pair of sinc filters in the FF filter chain path, the pair of input sine and cosine signals.

18. The resolver-to-digital conversion method of claim 17, further comprising:

bandpass filtering, by a pair of bandpass filters coupled between the second pair of sinc filters and an output of the FF filter chain path, the pair of sinc-filtered input sine and cosine signals.

19. The resolver-to-digital conversion method of claim 12, further comprising:
determining, by the FF filter chain path, an inverse tangent signal of the pair of sine and cosine signals; and
outputting an estimated rotation angle on which the estimated rotation speed of the FF filter path is based.

20. The resolver-to-digital conversion method of claim 12, further comprising:
determining, by a sine look-up-table (LUT) of the state observer of the FB filter chain loop, a feedback sine signal based on the estimated rotation angle of the object;
determining, by a cosine LUT of the state observer of the FB filter chain loop, a feedback cosine signal based on the estimated rotation angle of the object; and
combining the FB sine and cosine signals with the respective input cosine and sine signals to output an estimated rotation angle error signal.

* * * * *